US006258727B1

(12) United States Patent
Maccagnan

(10) Patent No.: US 6,258,727 B1
(45) Date of Patent: Jul. 10, 2001

(54) METHOD OF FORMING METAL LANDS AT THE M0 LEVEL WITH A NON SELECTIVE CHEMISTRY

(75) Inventor: Renzo Maccagnan, Villabe (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/356,970

(22) Filed: Jul. 19, 1999

(30) Foreign Application Priority Data

Jul. 31, 1998 (EP) .................................................. 98480050

(51) Int. Cl.⁷ ......................... H01L 21/302; H01L 21/44; H01L 21/4763; C23F 1/00
(52) U.S. Cl. .......................... 438/714; 438/597; 438/620; 438/636; 438/711; 438/720; 216/78
(58) Field of Search ..................................... 438/711, 706, 438/707, 710, 714, 718, 720, 723, 636, 597, 598, 620, 637, 638, 639, 672, 675; 216/78

(56) References Cited

U.S. PATENT DOCUMENTS

| | | | |
|---|---|---|---|
| 4,436,581 | * | 3/1984 | Okudaira et al. ..................... 156/643 |
| 4,948,459 | * | 8/1990 | van Laarhoven et al. .......... 156/643 |
| 5,173,442 | * | 12/1992 | Carey .................................... 437/173 |
| 5,670,425 | * | 9/1997 | Schinella et al. .................... 437/195 |
| 5,772,906 | * | 6/1998 | Abraham ............................... 216/72 |
| 5,874,345 | * | 2/1999 | Coronel et al. ...................... 438/427 |
| 5,930,585 | * | 7/1999 | Coronel et al. .......................... 438/5 |
| 6,025,271 | * | 2/2000 | Howard et al. ...................... 438/697 |
| 6,057,227 | * | 5/2000 | Harvey ................................. 438/637 |
| 6,140,226 | * | 10/2000 | Grill et al. ............................ 438/637 |

OTHER PUBLICATIONS

May et al., "Statistical Experimental Design in Plasma Etch Modeling", IEEE Trans. on Semicond. Manu., May 1991, pp. 83–98.*

* cited by examiner

Primary Examiner—Matthew Smith
Assistant Examiner—Lex H. Malsawma

(57) ABSTRACT

The starting structure consists of a silicon substrate having diffused regions formed therein and gate conductor stacks formed thereupon that is passivated by a TEOS layer as standard. At a further stage of the wafer fabrication process, contact holes exposing some diffused regions and top of gate conductor stacks have been formed. At least one contact hole exposing a diffused region has been filled with doped polysilicon and the structure has been coated with a layer of an anti-reflective material (ARC) then, with a patterned mask to expose the ARC layer at the contact holes locations. The process improvement essentially consists in the use of a non selective chemistry which etches the doped polysilicon, the ARC and TEOS materials at substantially the same rate in a RIE etcher. A NF3/CHF3 gas mixture with a 23/77 ratio is adequate in that respect. The etch time duration is controlled first by an optical etch end-point detection system adapted to detect the signal transition at the TEOS layer exposure and then by an interferometric etch endpoint detection system to monitor the etched thickness to accurately stop when the selected depth for the M0 land recesses is reached. Finally, said recesses are filled with a metal (e.g. tungsten) as standard to produce the desired M0 metal lands.

7 Claims, 10 Drawing Sheets

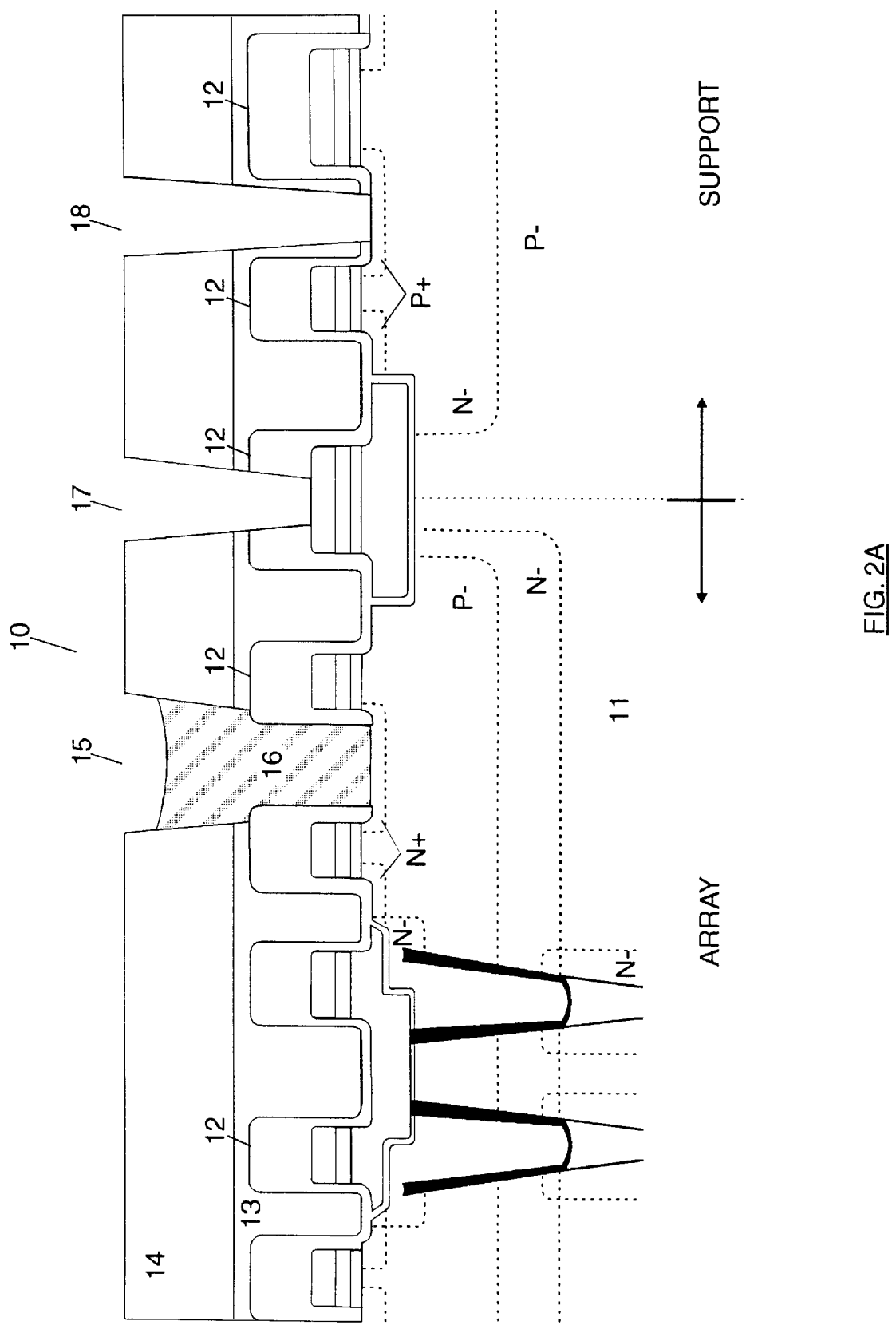

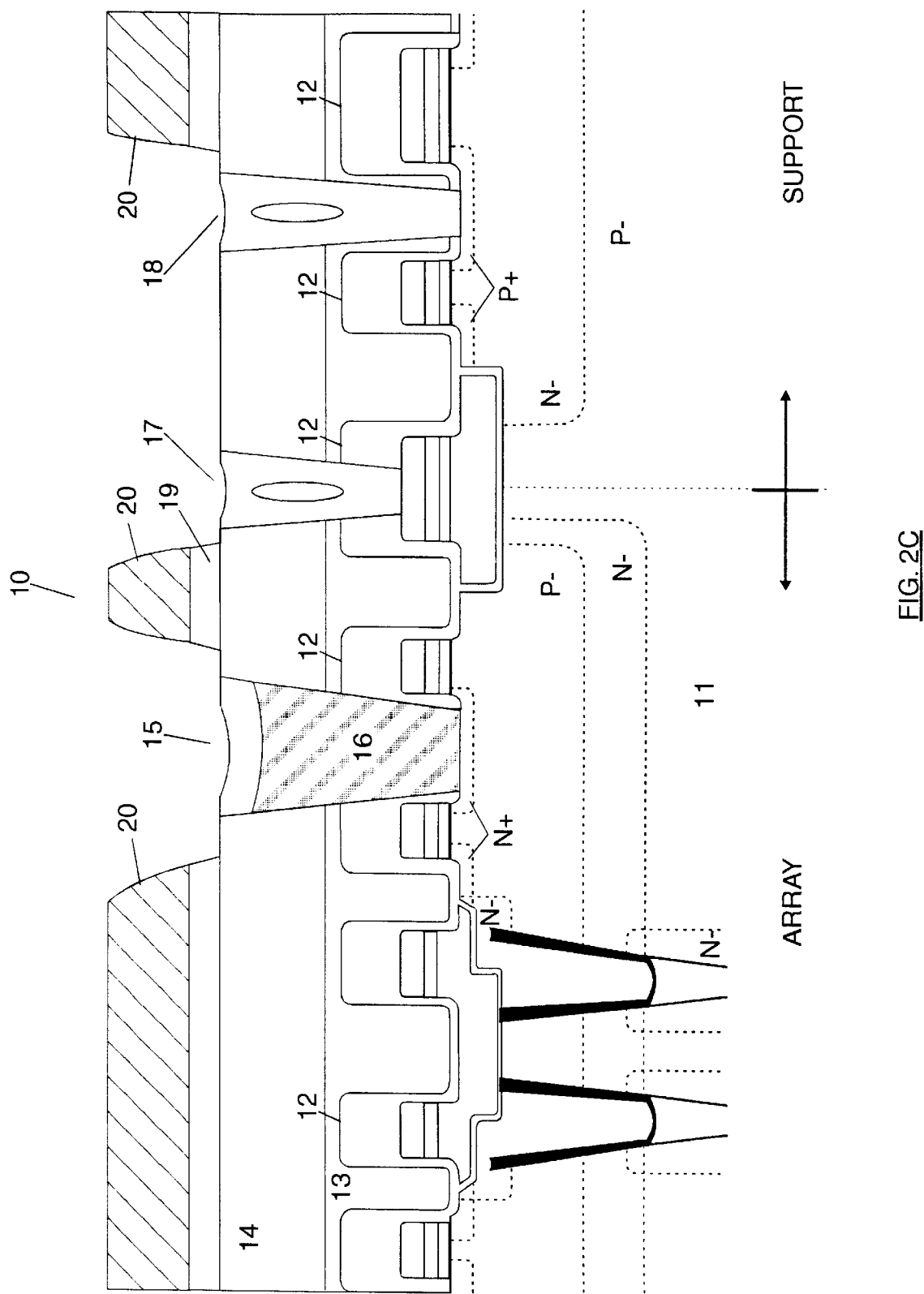

METHOD OF FORMING METAL LANDS AT THE M0 LEVEL WITH A NON SELECTIVE CHEMISTRY

FIELD OF INVENTION

The present invention relates to the manufacture of semiconductor integrated circuits (ICs) and more particularly to a method of forming metal lands at the M0 level by plasma etching with a non selective chemistry.

BACKGROUND OF THE INVENTION

In the manufacture of semiconductor integrated circuits, and particularly in Dynamic Random Access Memory (DRAM) chips, a metal interconnect at the first level, referred to herein below as the M0 level, is extensively used to address memory cells of the chip. In essence, it is used to interconnect the source regions of all the Insulated Gate Field Effect Transistors (IGFETs) driven by the same Word Line (WL) and the gate conductors of all the IGFETs driven by a same Bit Line (BL) to their respective driving IGFET at the chip periphery. Each word line consists of a metal land which is formed at the M0 photolithography level.

The essential steps of a conventional M0 metal lands formation process will be briefly described by reference to FIG. 1 and FIGS. 2A to 2E. After these steps have been completed, the metal contacts and lands of the M0 interconnect scheme are fabricated.

FIG. 1 schematically illustrates a state-of-the-art semiconductor structure 10 which is a part of a wafer at the initial stage of the M0 metal land formation process. Structure 10 basically comprises a silicon substrate 11 with diffused regions formed therein and a plurality of gate conductor stacks 12 formed thereon. A gate conductor stack consists of a composite SiO2/doped polysilicon/tungsten silicide structure. At the chip surface, two different zones are to be considered. First, the "array" zone wherein the memory cells are fabricated. Each elementary memory cell is comprised of an IGFET and its associated capacitor that is formed in a deep trench as standard. In the other zone referred to as the "support", one can find addressing and driver circuits. Structure 10 is coated with a boro-phosphosilicate-glass (BPSG) layer 13 and a tetra-ethyl-ortho-silicate (TEOS) oxide layer 14 above of it. These layers are conformally deposited onto structure 10 by LPCVD as standard. As apparent in FIG. 1, structure 10 has a substantially planar surface.

Now two types of contact holes are created depending upon their location at the chip surface. First, contact holes referred to as CB holes bearing numeral 15 in FIG. 2A are etched through layers 13 and 14 in the "array" area. A doped polysilicon layer 16 is conformally deposited onto structure 10 to fill contact hole 15 in excess. Next, the doped polysilicon is etched in a plasma until the TEOS layer 14 surface is reached. Then, the etching is continued to produce a recess (CB recess) in the polysilicon fill 16 as shown in FIG. 2A. CB recesses will be subsequently filled with metal to produce the desired M0 metal lands for the word lines. This etching is determined by time and is very critical because of its sensitivity to the etch duration. Because of product non-uniformities, this over etching is carefully conducted in order not to reach the TEOS/BPSG interface. The purpose of this step as a whole is to produce conductive studs 16 that will allow an electrical contact between M0 metal lands and N type diffused regions (e.g. a source region common to two adjacent IGFETs as illustrated in FIG. 2A) in the substrate 11. Contact holes 17 and 18 are etched through layers 13 and 14 in the "support" area at desired locations to expose gate conductor stacks of IGFETs and diffusion regions of the substrate 11 respectively and will be referred to as the CG and CD holes. The resulting structure is shown in FIG. 2A.

Now, turning to FIG. 2B, structure 10 is coated first with a 90 nm thick anti-reflective coating (ARC) layer 19 which fills all contact holes 15, 17 and 18, then with a 850 nm thick photoresist material 20. Adequate chemicals are supplied by SHIPLEY USA, Malborough, Mass., USA under references BARL 900 and UV2HS respectively. After deposition, the photoresist layer 20 is baked, exposed and developed as standard to leave a patterned layer, that will be referred to herein below as the M0 mask. The purpose of this mask is to define the locations of contacts and lands of the first interconnect level at the surface of structure 10.

After the M0 mask 20 has been defined, the process continues with an etch step to remove 270 nm of TEOS layer 14 at locations not protected by said M0 mask. To that end, the wafer is placed in the chamber of an AME 5200 MxP+RIE etcher, manufactured by Applied Materials, Santa Clara, Calif., USA, where it is etched with the two-step process detailed below.

The first step so-called "ARC OPEN", etches the ARC layer 19 down to the TEOS layer 14 top surface. This step is performed with a CF4 chemistry according to the following operating conditions given below.

| Step 1: | |
|---|---|
| CF4 | 40 sccm |
| Pressure | 45 mTorr |
| RF Power | 300 Watt |
| Mag. field | 40 Gauss |
| Wall temp. | 15° C. |
| Cathode temp. | 15° C. |
| He cooling | 14 Torr |
| Etch time | 80 s |

At this stage of the M0 land fabrication process, the structure 10 is shown in FIG. 2C. As apparent in FIG. 2C, openings in M0 mask 20 have tapered side walls. This will widen the M0 land size reducing thereby the process window of the previous M0 lithographic step.

The second step etches about 270 nm of the TEOS layer 14 to produce the desired recesses wherein the M0 metal lands will be subsequently formed. Process parameters for step 2 read as follows:

| Step 2: | |
|---|---|
| CHF3 | 35 sccm |
| CF4 | 25 sccm |
| Argon | 150 sccm |
| Pressure | 160 mTorr |
| RF Power | 1000 Watt |
| Mag. field | 0 Gauss |
| Wall temp | 15° C. |
| Cathode temp. | 15° C. |
| He cooling | 14 Torr |
| Etch time | 34 s |

The resulting structure is shown in FIG. 2D, where recesses are referenced 21 and 22 depending they are located in the "array" or "support" region. They will be referred to as land recesses 21/22 herein below.

Unfortunately, the above-described two-step etch process is not satisfactory. As mentioned above, step 1 produces tapered contact holes because the CF4 chemistry is very sensitive to ARC layer 19 thickness variations (its thickness can vary in the 700–1100 nm range), so that land recesses 21/22 dimensional can significantly vary center-to-edge of a same wafer. This can be avoided by a very long etch duration, but at the potential risk of a degradation in the contact hole side wall sharpness. Tapered contact holes are a potential source of electrical shorts occurring between two adjacent M0 metal lands, in turn resulting in a high number of failed cells. On the contrary, if in an attempt to avoid such shorts, contact holes are under etched, too resistive M0 metal lands would be produced. In addition, the chemistry of step 2 has different etch rates between ARC, polysilicon and TEOS materials producing similar resistance related problems.

Now turning to the right part of FIG. 2C, in the "support" region, it is clear that CG and CD contact holes 17 and 18 are still filled with ARC material. During step 2, as the CHF3/CF4/Ar chemistry etches TEOS SiO2 much more faster than ARC material and because contact holes 17 and 18 are tapered, the ARC material acts as a mask and blocks etching of the TEOS SiO2 material of layer 14 at their close proximity. As a result, TEOS SiO2 fences 23 remain around ARC filled contact holes 17 and 18 and depressions 24 are also are created at these locations as visible in FIG. 2D. The same particularities occur in the "array" region as apparent in the left part of FIG. 2D. It can be also noticed that because the chemistry of step 2 is unable to etch polysilicon stud 16, the latter is higher than the M0 level.

At this stage of the process, the remaining ARC and photoresist materials are removed using a conventional strip process. Then, a 25 nm thick dual adhesion layer of titanium/titanium nitride (Ti/TiN) forming a liner is deposited onto the wafer by sputtering. This is followed by the blanket deposition of a tungsten (W) layer by Chemical Vapor Deposition (CVD). Next, the wafer is chem-mech polished with an adequate slurry to remove the tungsten and titanium/titanium nitride in excess. as a final result, a planar silicon structure provided with M0 tungsten lands is produced as shown in FIG. 2E. As apparent in FIG. 2E, polysilicon stud 16 cause a thinning of the M0 tungsten land 25 in the array region (not true in the support region), thereby degrading its electrical resistance.

Fences 23 and depressions 24 around contact holes 15, 17 and 18 can cause a discontinuity in the 25 nm Ti/TiN liner as apparent in the left part of FIG. 2E. As a consequence, Ti silicidation is incomplete, leading thereby to the contact resistance alteration mentioned above. In addition, oxide fences 23 around contacts can create stresses in the M0 tungsten lands, which in turn, could also cause reliability failures.

SUMMARY OF THE PRESENT INVENTION

It is therefore a primary object of the present invention to provide a method of forming metal lands at the M0 level with a non selective chemistry.

It is another object of the present invention to provide a method of forming metal lands at the M0 level with a non selective chemistry wherein the CB recess etching step is no longer necessary.

It is another object of the present invention to provide a method of forming metal lands at the M0 level with a non selective chemistry which eliminates oxide fences and depressions around the M0 land recesses for increased reliability.

It is still another object of the present invention to provide a method of forming metal lands at the M0 level with a non selective chemistry that produces M0 land recesses with uniform depth and size to ensure a better liner continuity improving M0 metal land electrical resistance.

It is still another further object of the present invention to provide a method of forming metal lands at the M0 level with a non selective chemistry which etches doped polysilicon, ARC and TEOS materials at substantially the same etch rate.

It is still another further object of the present invention to provide a method of forming metal lands at the M0 level with a non selective chemistry which widens the process window at the M0 lithographic level.

The accomplishment of these and other related objects is achieved by the method of the present invention which aims to get rid of these drawbacks.

According to the method of the present invention, there is disclosed both process and system improvements to allow M0 mask patterning by plasma etching with a non selective chemistry which produces M0 land recesses with a high depth and size uniformity across a same wafer. The starting structure consists of a silicon substrate having diffused regions formed therein and gate conductor stacks formed thereupon which is passivated by a TEOS layer coating as standard. At a further stage of the wafer fabrication process, contact holes exposing some diffused regions and tops of gate conductor stacks have been formed. At least one contact hole in the array region exposing a diffused region has been filled with doped polysilicon. The structure has been coated with an anti reflective material (ARC) then masked to expose the ARC material at the M0 contact holes locations. The process improvement essentially consists in the use of a non selective chemistry which etches the doped polysilicon, the ARC and TEOS materials at substantially the same rate. A NF3/CHF3 gas mixture with a 23/77 ratio is adequate in that respect. The etch time duration is first controlled by an optical etch endpoint detection system adapted to detect the signal transition at TEOS layer exposure. Then, an interferometric etch endpoint detection system is used to monitor the etched thickness to accurately stop when the selected depth for the M0 land recess is reached. The method is improved in some extent when the RIE etcher uses an electrostatic chuck device provided with a peripheral "VESPEL" focus ring.

The novel features believed to be characteristic of this invention are set forth in the appended claims. The invention itself, however, as well as these and other objects and advantages thereof, will be best understood by reference to the following detailed description of an illustrated preferred embodiment to be read in conjunction with the accompanying drawings.

BRIEF DESCRIPTION OF THE DRAWINGS

FIGS. 2A to 2E show the structure of FIG. 1 undergoing the sequence of steps of the conventional M0 contact/land formation process.

DESCRIPTION OF A PREFERRED EMBODIMENT

Applicant's inventor has discovered that the plasma etching process of the prior art method described above by reference to FIG. 1 and FIGS. 2A to 2E can be significantly improved. The essential point consists in an etching chemistry change which in turn requires some modifications in the above described operating conditions. An additional process optimization may be obtained thanks to a different wafer plasma environment.

First of all, it has been experimentally demonstrated that to improve the process of etching the ARC layer 19 and the TEOS layer 14 to produce the desired M0 land recesses with an uniform result, the chemistry must not be selective, i.e., it must be able to etch ARC, TEOS and doped polysilicon materials at the same rate. Moreover this chemistry must not contain oxygen to avoid any degradation of the M0 land recess side walls. As a result, with such a chemistry, the step of etching the polysilicon stud 16 described by reference to FIG. 2A is no longer necessary and openings in the M0 mask 20 no longer tapered.

Figure 1:
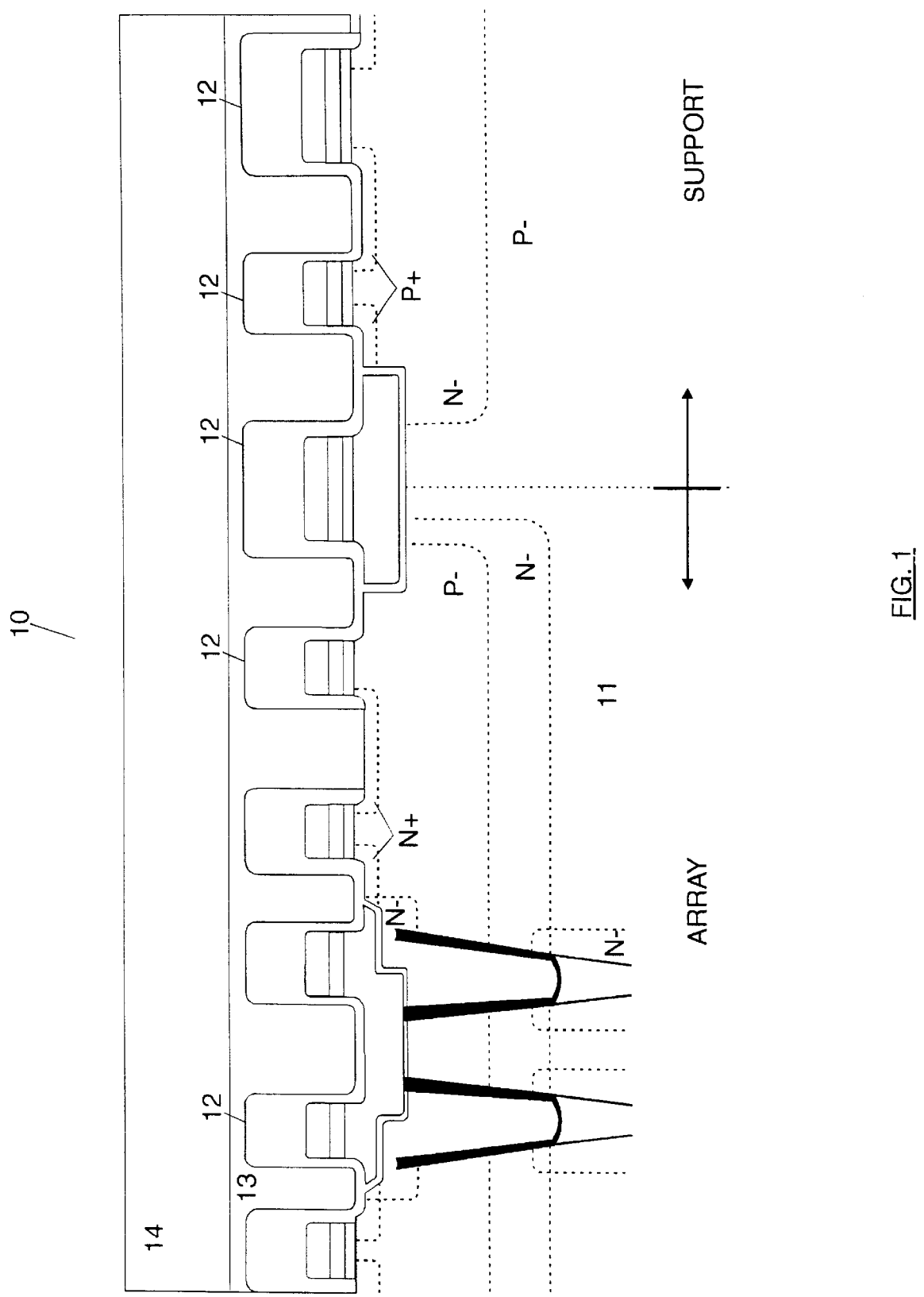
FIG. 1 shows a state-of-the-art structure after diffused source/drain regions and gate conductor stack completion coated with a dual bottom BPSG/top TEOS layer.
Figure 2B:
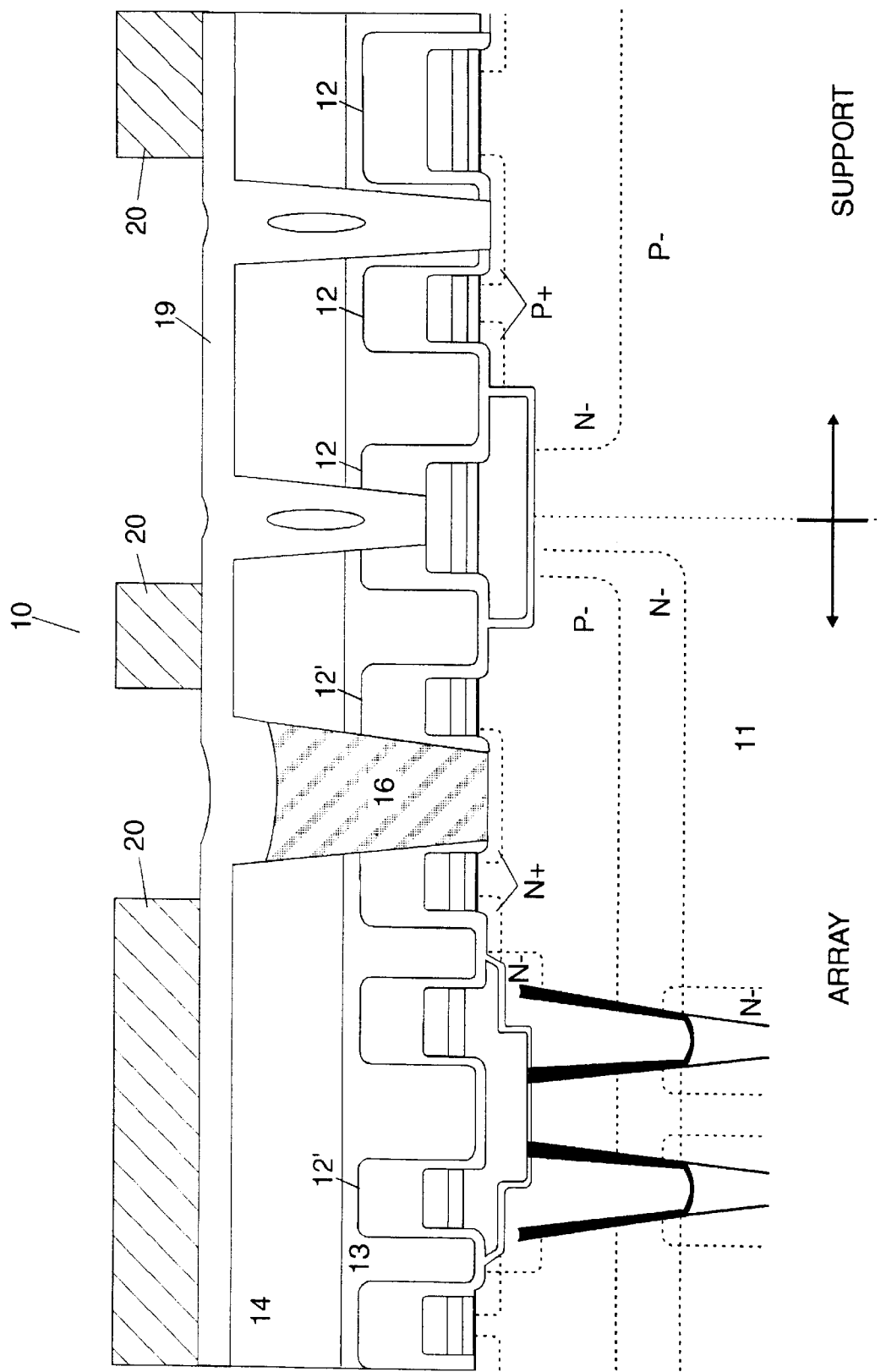
Figure 2D:
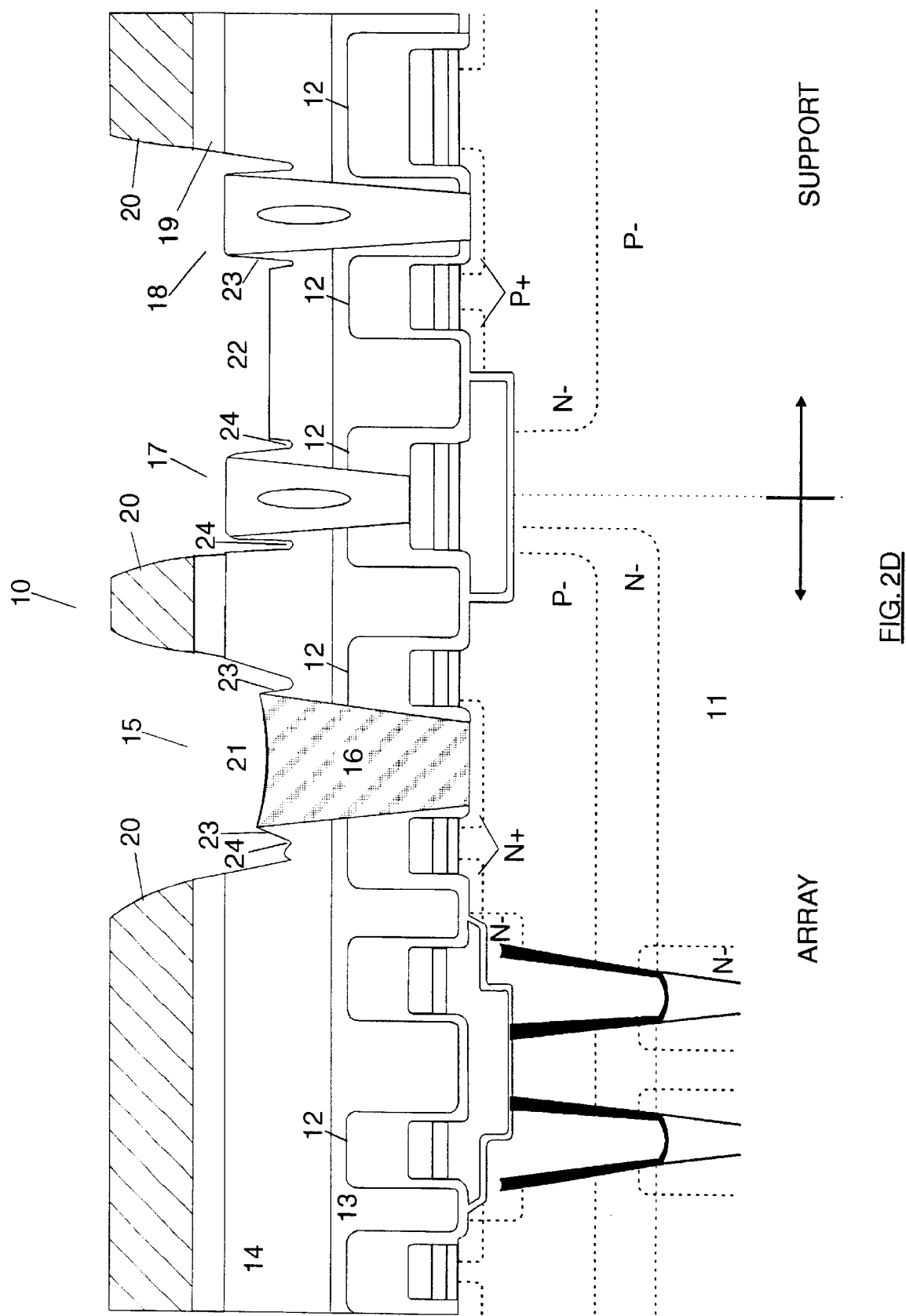
Figure 2E:
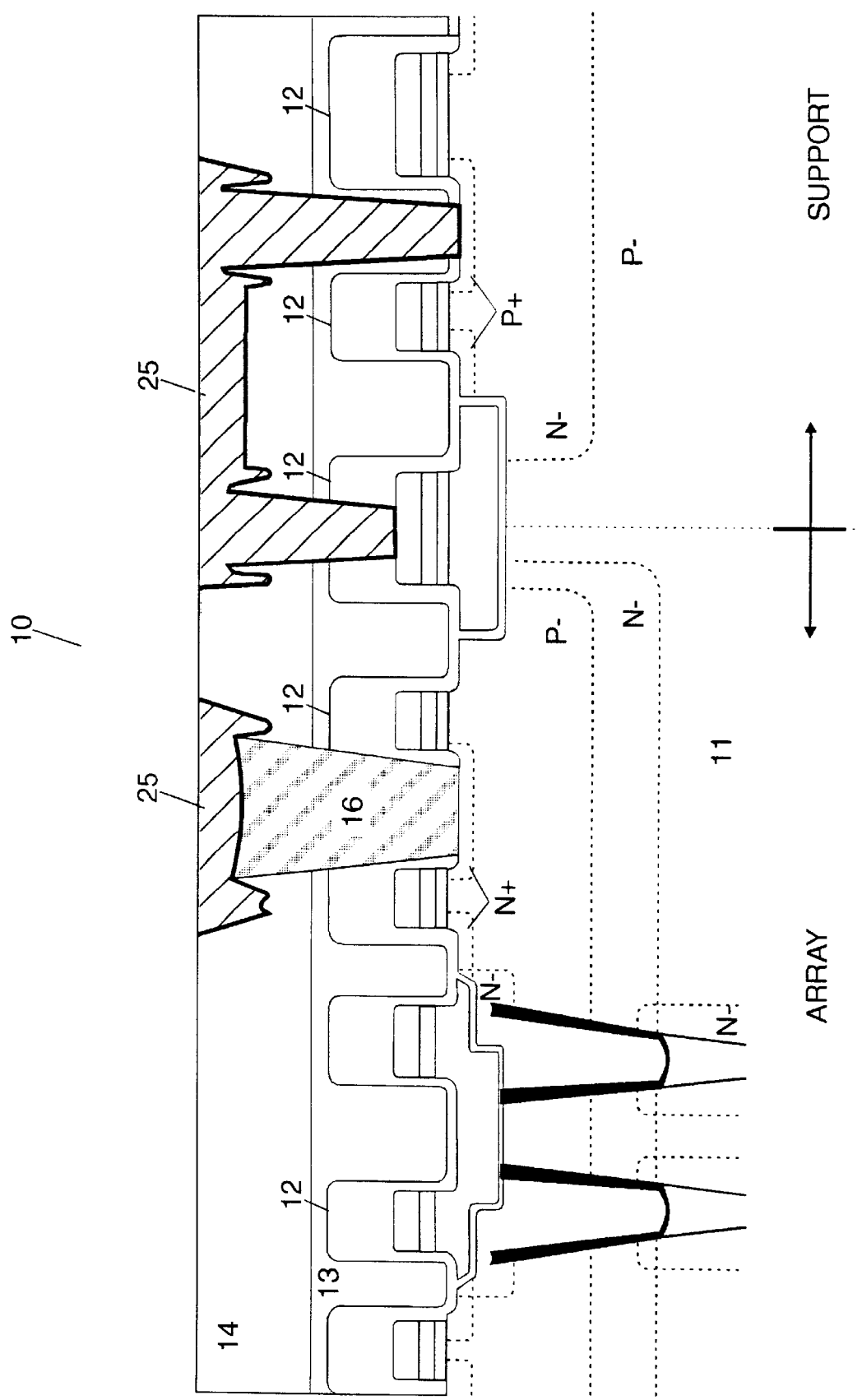
Figure 3A:
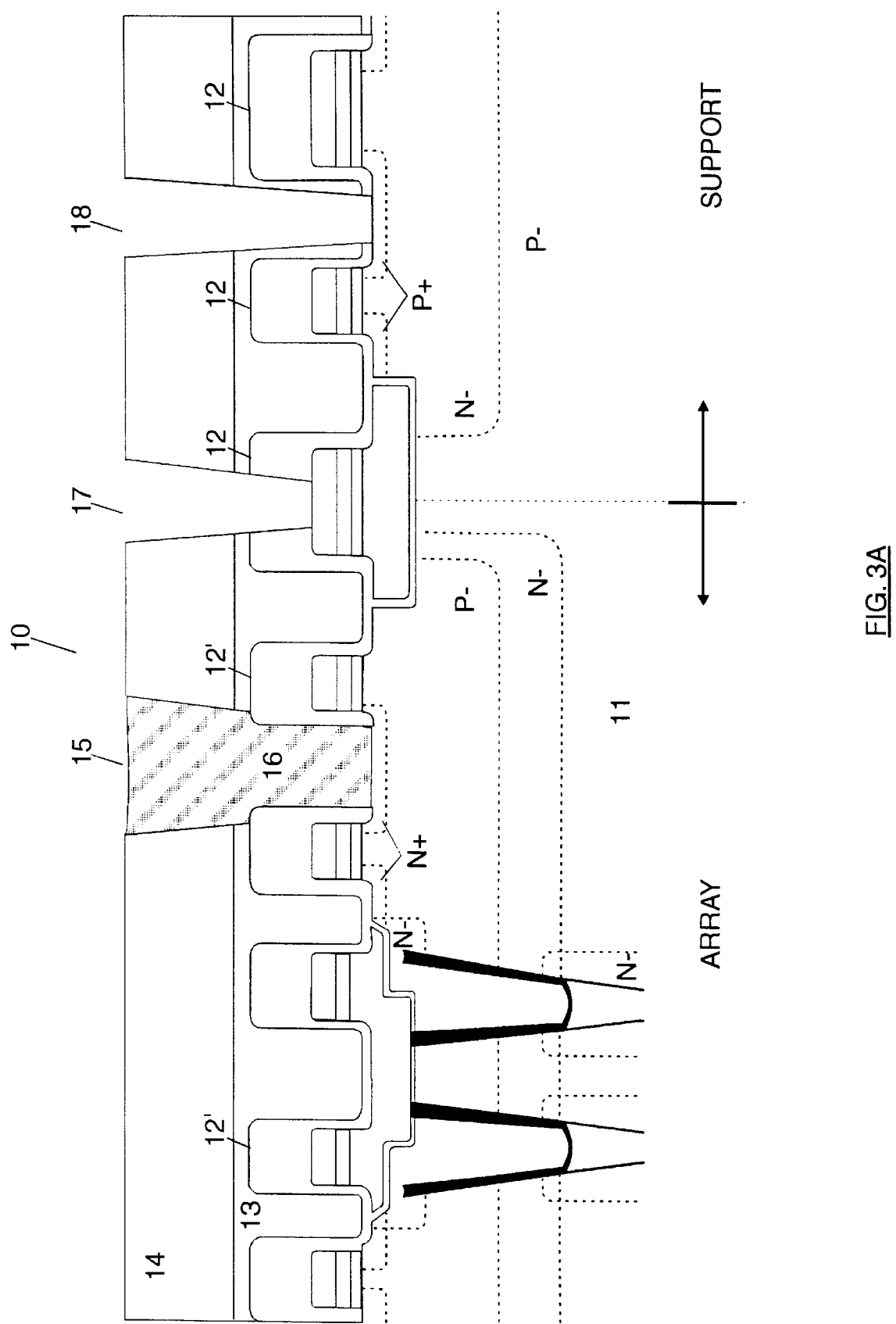
FIGS. 3A to 3D show the structure of FIG. 1 undergoing the sequence of steps of the improved M0 contact/land formation process according to the method of the present invention.
Figure 3B:
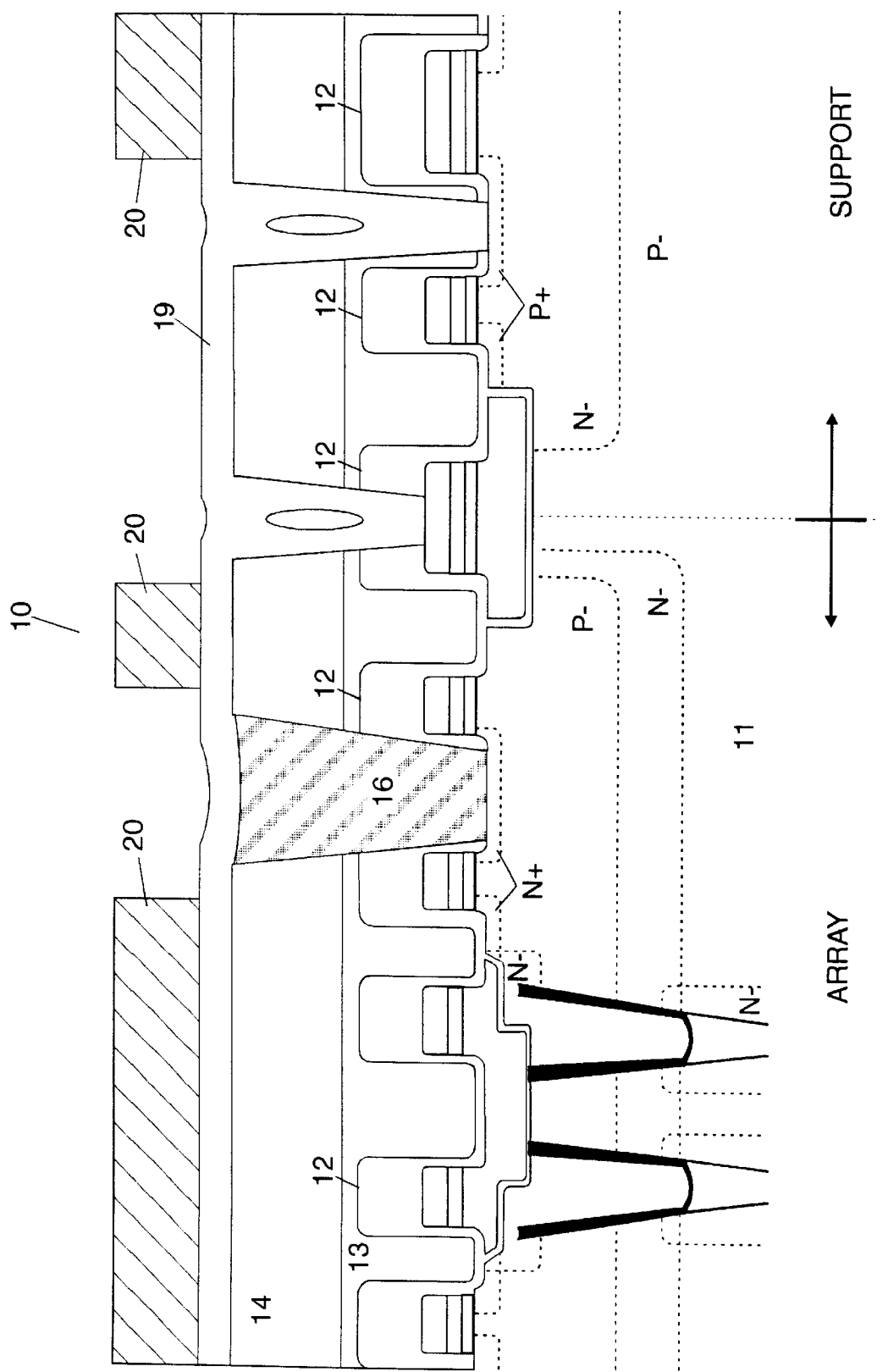

The starting structure is still the FIG. 1 structure 10. The sequence of processing steps described above by reference to FIG. 2A is the same except in that there is no etching of the polysilicon stud 16. As apparent in FIG. 3A, now the top of the polysilicon stud 16 is coplanar with the TEOS layer 14 surface. This is an essential feature of the novel method of the present invention. Now, the ARC layer 19 and the M0 mask 20 are formed as described above by reference to FIG. 2B. The resulting structure is shown in FIG. 3B. Next, M0 land recesses will be formed according to a novel etch step which is based upon a non-selective chemistry as it will be described below.

The novel etch process is still run in the MxP+oxide chamber of the AME 5200 RIE etcher mentioned above that has a S3 electrostatic chuck device, but preferably with a VESPEL focus ring for process optimization. Its presence ensures a plasma environment that does not degrade the photoresist material as it does not contain oxygen. Process parameters for the etching of the ARC, TEOS and doped polysilicon materials are given below. A NF3/CHF3 gas mixture with a 23/77 ratio in percent is adequate in all respects to reduce to practice the method of the present invention.

| | |
|---|---|
| NF3 | 30 sccm |
| CHF3 | 100 sccm |
| Pressure | 140 mTorr |
| RF Power | 600 Watt |
| Mag. field | 0 Gauss |
| Wall temp. | 55° C. |
| Cathode temp. | 18° C. |
| He cooling | 8 Torr |
| Etch time | etch endpoint controlled |

Figure 3C:
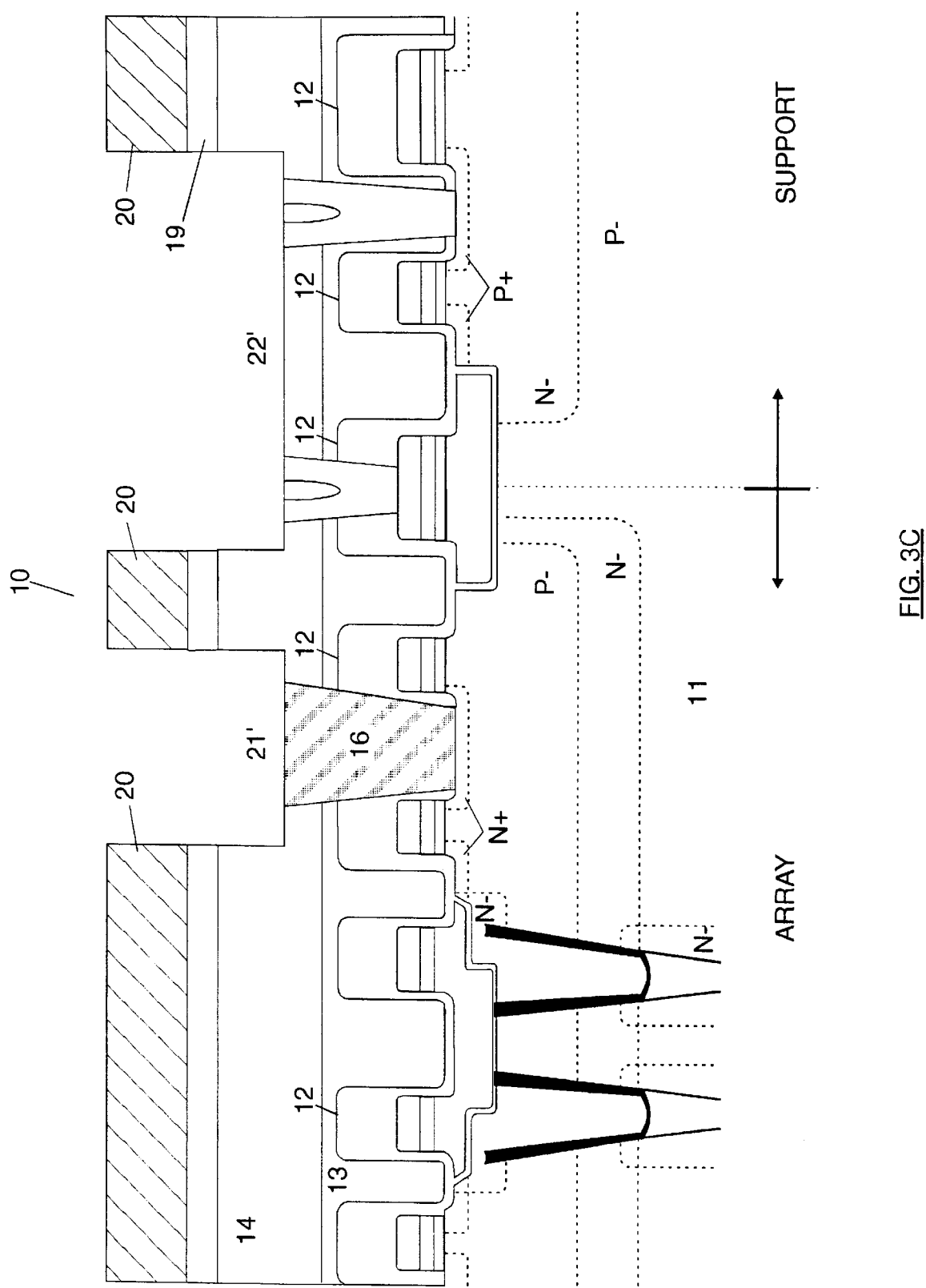

This particular NF3/CHF3 ratio offers the lowest selectivity. As a matter of fact it etches the TEOS, doped polysilicon and ARC materials at about 160 nm/mn. This is another key feature for this new etch process. Finally, the photoresist material of the M0 mask 20 is stripped as standard. At this stage of the M0 contact/land formation process the structure is depicted in FIG. 3C.

The whole etch process is adequately monitored by an optical/interferometric etch end point detection system such as model MS 550 sold by SOFIE INSTRUMENTS SA, Arpajon, France that is provided with two channels. This system can detect very accurately the exposure of the TEOS layer 14. Then, starting from this point, the monitoring is continued by thickness measurement performed by interferometry in order to control the etched depth in the TEOS layer.

In essence, the first channel monitors the emission of the 483.5 nm CO line. The emitted power of this emission is very low during all the ARC material etch operation. As soon as TEOS layer top surface is reached, the carbon from the CHF3 and the oxygen of the TEOS oxide material combine together to produce an immediate CO emission which increases very fastly, producing thereby a very sharp intensity signal transition. The second channel monitors the 253.7 nm Hg (mercury) line which is supplied by an external light source so that it is not influenced by the plasma. This line interferes with top and bottom of TEOS oxide layer 14 and produces a signal that allows TEOS thickness change monitoring. As soon as the first channel has detected the TEOS oxide layer top surface, it sends a signal to the second channel which in turn starts the measurement of the etched TEOS oxide amount. When the targeted M0 land recess depth, i.e. 270 nm, has been reached, the etch process is automatically stopped. Using the novel operating conditions as cited above, the etch duration is about 130 s. The M0 contact/land recess depth is substantially constant all across the wafer, wafer to wafer, lot to lot.

Figure 3D:
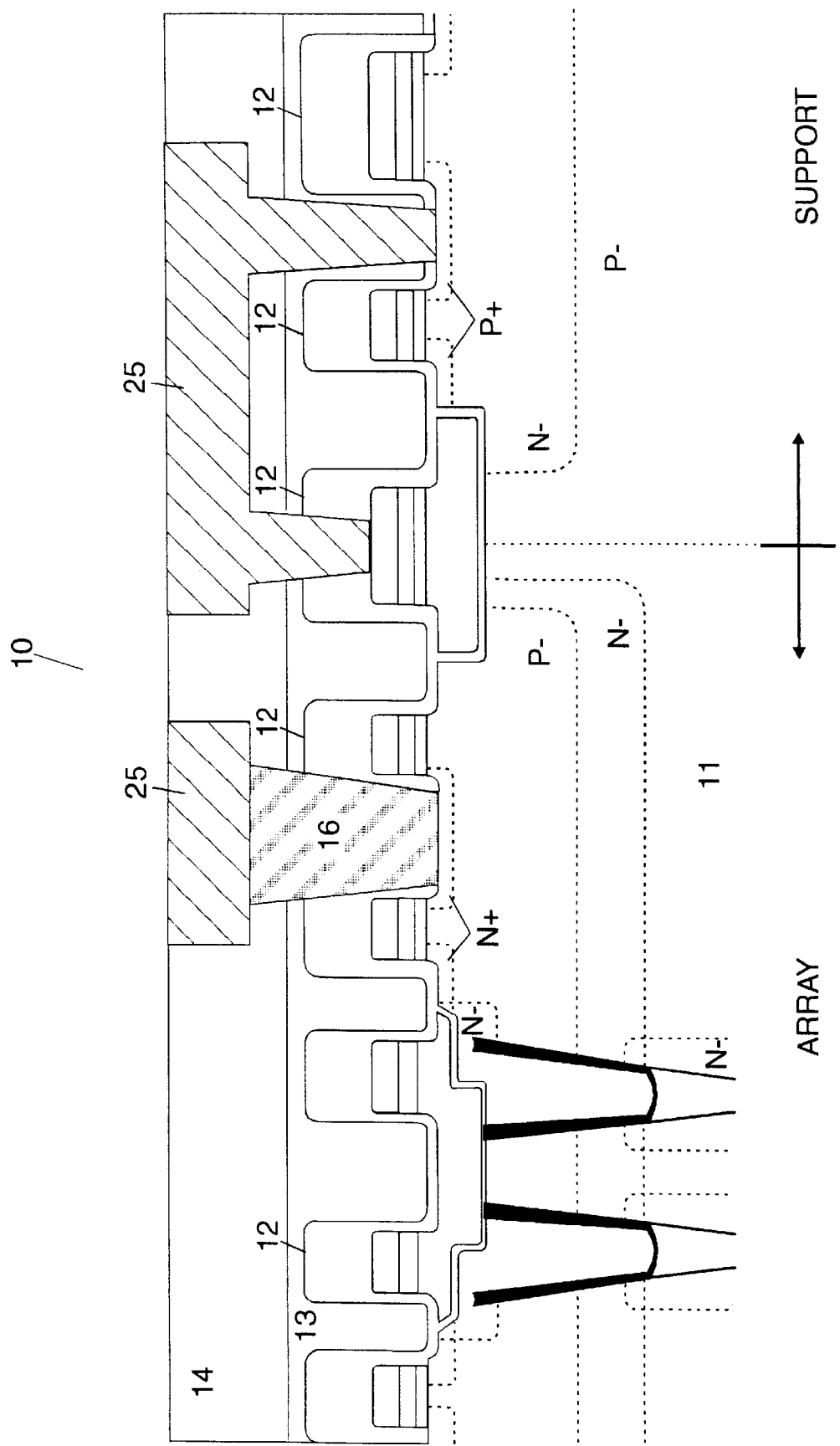

Finally, said M0 contact/land recesses are filled with tungsten according to the same sequence of steps described above by reference to FIG. 2E. At the end of the M0 tungsten land formation process, the final structure is shown in FIG. 3D.

When this process improvement is implemented, the new etch step is able to provide M0 land recesses with a perfectly planar bottom surface. Moreover, fences and depressions are eliminated and the polysilicon stud 16 is now etched back in such a manner that there is a great depth and size uniformity of the M0 land recesses across the whole wafer. Finally, M0 tungsten land electrical resistance is significantly lowered improving thereby the switching speed of IGFETs.

What is claimed is:

1. A method of forming metal lands at the M0 level onto a silicon structure comprising the steps of:

a) providing a structure comprised of a silicon substrate having diffused regions formed therein and gate conductor stacks formed thereon; said structure being passivated by an insulating layer;

b) forming contact holes exposing some tops of said gate conductor stacks and diffused regions;

c) filling at least one of said contact holes exposing a diffused region with doped polysilicon to form a conductive stud therein which is coplanar with the insulating layer surface;

d) depositing a layer of an anti-reflective coating (ARC) material onto the structure; said material filling contact holes not filled with doped polysilicon;

e) forming a mask at the surface of the structure referred to as the M0 mask exposing the ARC material at desired locations above said contact holes;

f) etching the masked structure through the ARC layer and through the insulating layer down to the desired depth in a RIE etcher with a non selective chemistry which etches doped polysilicon, ARC and insulating materials at substantially the same rate to create M0 land recesses;

g) removing the remaining ARC material and the overlying mask; and, h) filling said land recesses with a conductive material such as a metal so that the metal and the insulating material top surface are substantially co-planar thereby defining M0 metal lands.

2. The method of claim 1 wherein the insulating material is tetra-ethyl-ortho-silicate (TEOS) and the metal is tungsten.

3. The method of claim 2 wherein said non selective chemistry consists of a NF3/CHF3 gas mixture.

4. The method of claim 3 wherein the NF3/CHF3 ratio is 23/77.

5. The method of claim 4 wherein the operating conditions are:

| | |
|---|---|
| NF3 | 30 sccm |
| CHF3 | 100 sccm |
| Pressure | 140 mTorr |
| RF Power | 600 Watt |
| Mag. field | 0 Gauss |
| Wall temp. | 55° C. |
| Cathode temp. | 18° C. |
| He cooling | 8 Torr. |

6. The method of claim 2 wherein the etch time duration is controlled first by an optical etch endpoint detection system adapted to detect the signal transition at TEOS layer exposure and then by an interferometric etch endpoint detection system to monitor the etched thickness to accurately stop when the selected depth for the M0 land recess is reached.

7. The method of claim 1 wherein the RIE etcher is provided with a peripheral "VESPEL" focus ring.

* * * * *